United States Patent [19]

Zanders

[11] Patent Number: 5,218,225
[45] Date of Patent: Jun. 8, 1993

[54] THIN-FILM RESISTOR LAYOUT

[75] Inventor: Gary V. Zanders, Dallas, Tex.

[73] Assignee: Dallas Semiconductor Corp., Dallas, Tex.

[21] Appl. No.: 502,267

[22] Filed: Mar. 30, 1990

[51] Int. Cl.$^5$ .............. H01L 21/40; H01C 1/012
[52] U.S. Cl. ...................... 257/538; 257/537; 338/309
[58] Field of Search ............... 357/51, 68, 65

[56] References Cited

U.S. PATENT DOCUMENTS

| | | | |
|---|---|---|---|
| 4,320,664 | 3/1982 | Rehn et al. ............... | 73/721 |
| 4,446,613 | 5/1984 | Beinglass et al. .......... | 351/51 |
| 4,446,613 | 5/1984 | Beinglass et al. .......... | 437/180 |
| 4,695,853 | 9/1987 | Hackleman et al. ......... | 346/140 R |
| 4,725,876 | 2/1988 | Kishi ..................... | 351/51 |
| 4,725,876 | 2/1988 | Kishi ..................... | 351/51 |
| 4,760,369 | 7/1988 | Tiku ...................... | 437/8 |
| 4,947,020 | 8/1990 | Imamura et al. ........... | 219/121.65 |
| 4,948,747 | 8/1990 | Pfiester .................. | 351/51 |
| 4,951,118 | 8/1990 | Nakamura ................. | 357/51 |

FOREIGN PATENT DOCUMENTS

| | | | |
|---|---|---|---|
| 0288803 | 11/1988 | European Pat. Off. ....... | 351/51 |
| 0298574 | 1/1989 | European Pat. Off. . | |

*Primary Examiner*—Eugene R. LaRoche
*Assistant Examiner*—Viet Q. Nguyen
*Attorney, Agent, or Firm*—Worsham, Forsythe, Sampels & Wooldridge

[57] ABSTRACT

A class of layout patterns for variable resistors and integrated circuits where the resistance is varied by varying a wiping point on a resistor line; contact is not made into the resistor line itself, but instead all contacts are made only to tabs which extend out from the resistor line. Preferred embodiments use a meander resistor line made of polysilicon within a silicon integrated circuit. Simple processing mask modifications can be used to change the geometry of the meander line to vary the resistance. The wiping point is digitally selected.

18 Claims, 11 Drawing Sheets

CONTACT, P+ (DASHED) AND METAL

POT CELL

BLOCK DIAGRAM

CASCADING MULTIPLE DEVICES

WRITING DATA

READING DATA

TIMING DIAGRAM

DS1267 LAYOUT
BLOCK DIAGRAM

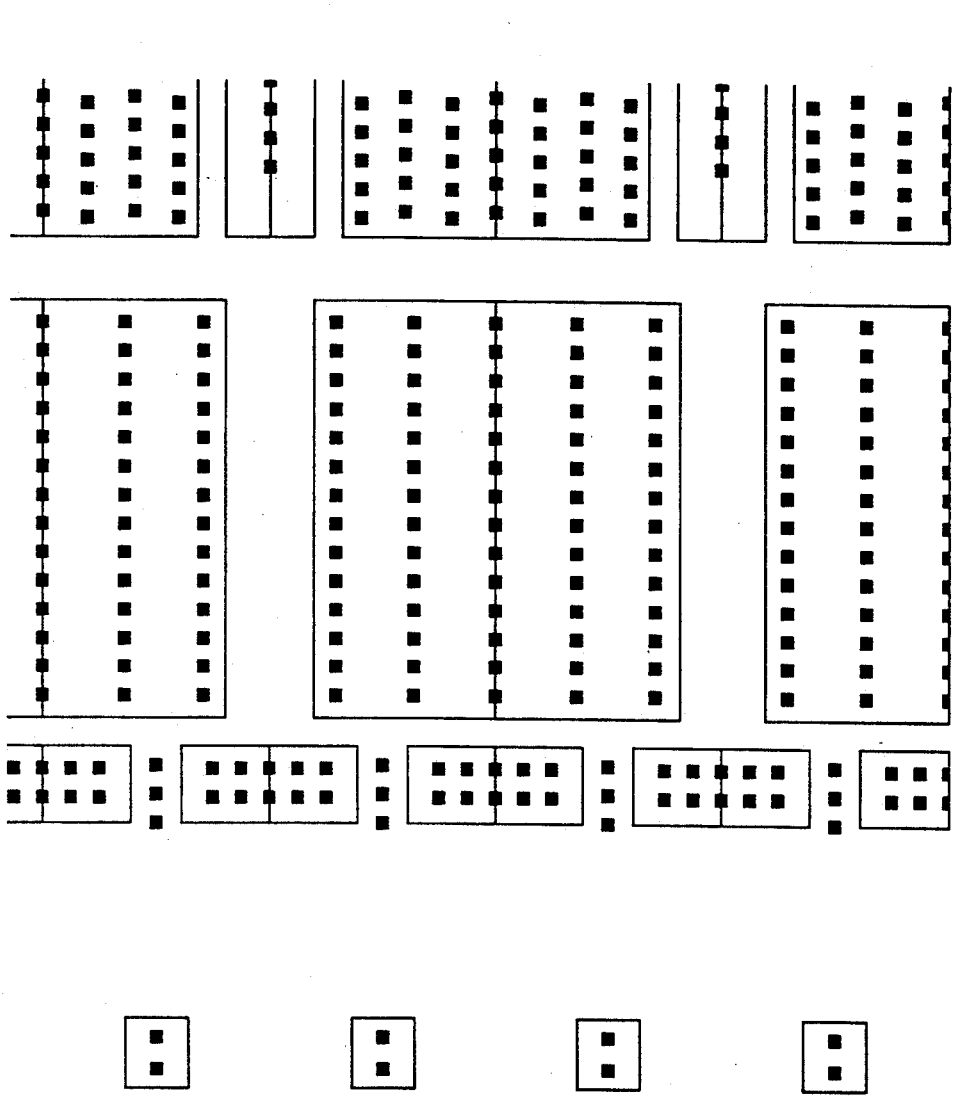
FIG. 7A
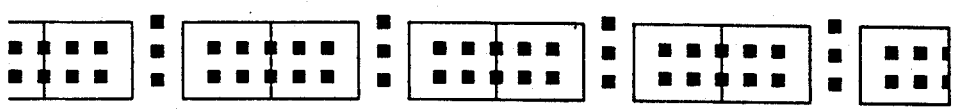

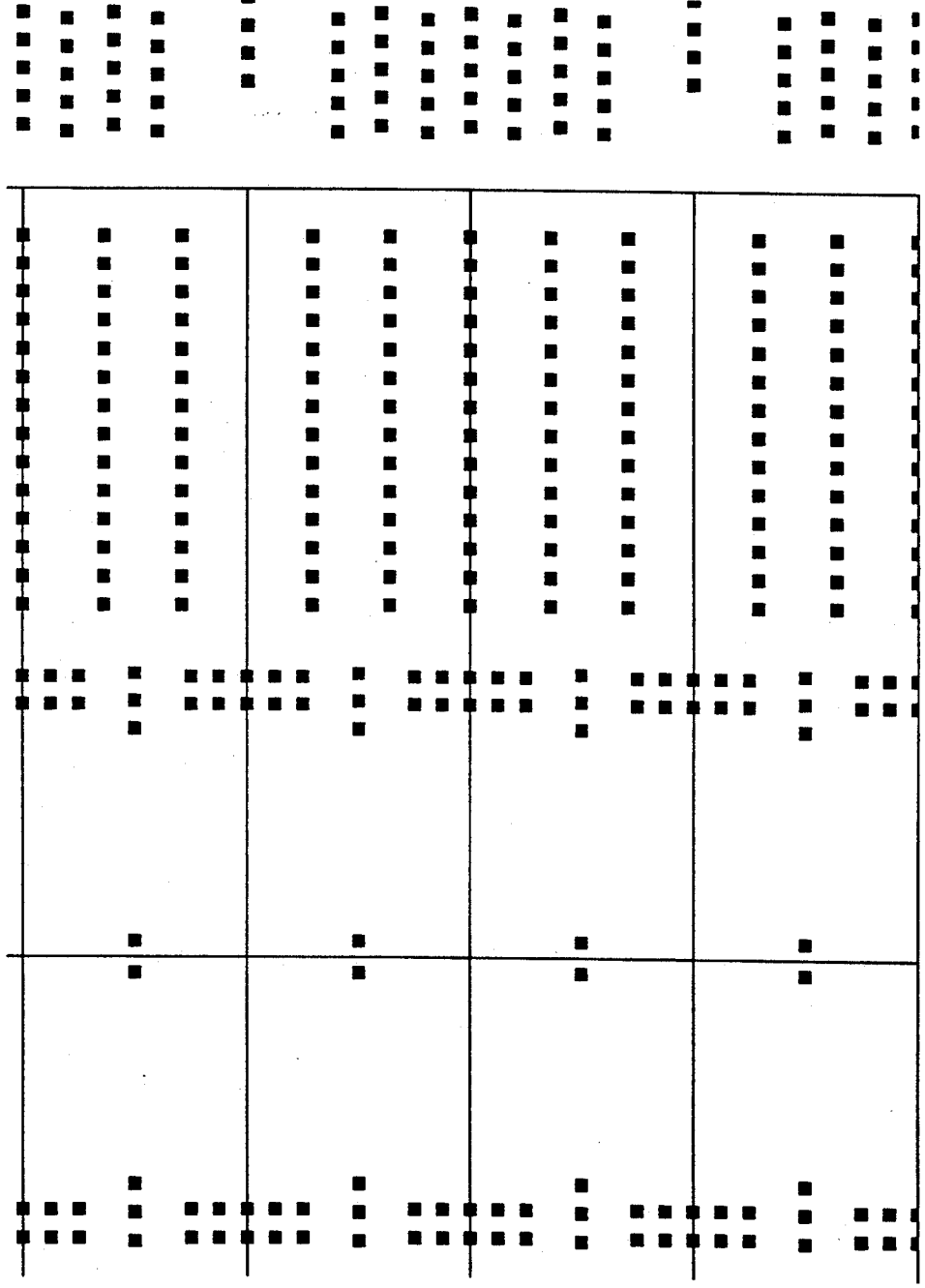

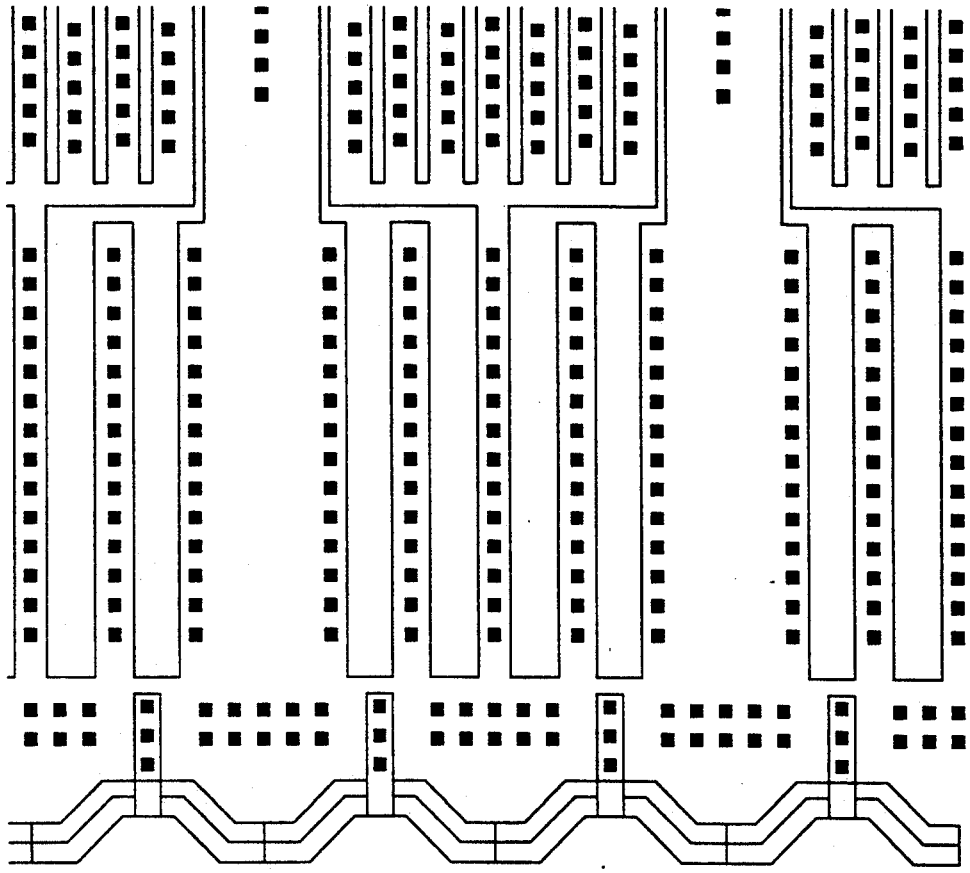
FIG. 7D-2
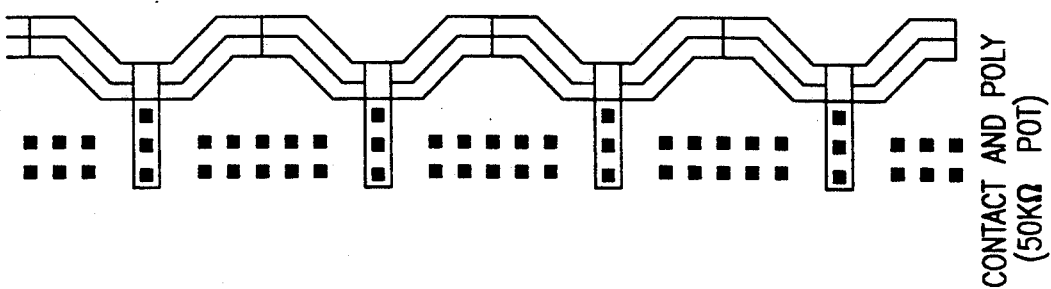

PIN DESCRIPTION

PIN NAMES

L0,L1 — LOWER END OF RESISTOR
H0,H1 — HIGHER END OF RESISTOR
W0,W1 — WIPER END OF RESISTOR
$V_B$ — SUBSTRATE BIAS
$S_{OUT}$ — WIPER FOR STACKED CONFIGURATION
$\overline{RST}$ — SERIAL PORT RESET INPUT
DQ — SERIAL PORT DATA INPUT/OUTPUT
CLK — SERIAL PORT CLOCK INPUT
$C_{OUT}$ — CASCADE SERIAL PORT OUTPUT
$V_{CC}$ — +5 VOLT INPUT
GND — GROUND
NC — NO CONNECTION

THIN-FILM RESISTOR LAYOUT

CROSS-REFERENCE TO OTHER APPLICATIONS

The following applications of common assignee contain related subject matter, and are believed to have effective filing dates identical with that of the present application:

Ser. No. 07/502,269, filed Mar. 30, 1990, entitled "DIGITAL POTENTIOMETER WITH STACKABLE CONFIGURATION";

Ser. No. 07/502,469 filed Mar. 30, 1990, entitled "DIRECTLY-WRITABLE DIGITAL POTENTIOMETER"; and Ser. No. 07/502,271, filed Mar. 30, 1990, entitled "DIRECTLY-WRITABLE DIGITAL CAPACITOR"; all of which are hereby incorporated by reference.

BACKGROUND AND SUMMARY OF THE INVENTION

The present invention relates to analog integrated circuits, and particularly to integrated circuits which provide a tapped resistor on-chip to achiece a selectable resistance value.

SOME PREVIOUS INTEGRATED CIRCUITS WITH PROGRAMMABLE RESISTANCE

Xicor's X9MME part, which is believed to be prior art to the present application (at least in the form here described), is an "E$^2$POT TM Digitally Controlled Potentiometer." This part is described, in the Xicor literature, as "a solid state non-volatile potentiometer" which "is ideal for digitally controlled resistance trimming. The X9MME is a resistor array composed of 99 resistive elements. Between each element and at either end are tap points accessible to the wiper element. The position of the wiper element on the array is controlled by the CS*, U/D*, and INC* inputs. The position of the wiper can be stored in nonvolatile memory and is recalled upon a subsequent power-up." The U/D* (up/down) input "controls the direction of the wiper movement . . . ." The increment (INC*) input, when toggled, will "move the wiper and either increment or decrement the counter in the direction indicated by the logic level on the U/D* input."

Banezhad and Gregorian, "A Programmable Gain/Loss Circuit," 22 *IEEE Journal of Solid-State Circuits* 1082 (1987), shows a programmable circuit which can provide gain/loss values from −25.5 dB to +25.5 dB, in 0.1 dB increments. The individual gain/loss stages are apparently provided by op amp[1] stages with resistive voltage dividers switched into the feedback connection (for gain) or into the output line (for loss).

[1] "Op amps," or operational amplifiers, are voltage amplifiers with highly linear gain characteristics. They are used as building blocks in a wide variety of analog circuits.

U.S. Pat. No. 4,849,903 to Fletcher and Ross, entitled "Digitally controlled system for effecting and presenting a selected electrical resistance," purports to show A digitally controlled resistance generator (10) in which resistors (16-38) having values selected according to an expression $2^{N-1}R$, where N is equal to the number of terms in the expression, and R is equal to the lowest value of resistance, are electrically inserted into a resistive circuit in accordance with a parallel binary signal provided by an analog-to-digital converter (46) or a programmable computer (75). This binary signal is coupled via optical isolators (50-72) which, when activated by a logical "1," provides a negative potential to some or all of the gate inputs (96) of the normally "on" field effect transistors (98-120) which, when "on," shorts out the associated resistor. This applied negative potential turns the field effect transistors "off" and electrically inserts the resistor coupled between the source terminal (124) and the drain terminal (122) of that field effect transistor into the resistive circuit between the terminals (12, 14).[2]

[2] This patent also contains some interesting comments on the prior art, and on the motivation for a digital potentiometer, as follows:
"Other devices which may be used to generate a variable resistance include digitally controlled audio attenuators, two types of which are manufactured by National Semiconductor and DBX of New York. The National device can be incremented in 3 dB steps, which attenuates voltage or current by a factor 0.5, while the DBX device is capable of attenuating in 1 dB steps. Problems with these attenuators, however, are that even the smallest dB steps do not provide the resolution necessary to mimic a smoothly rising or falling resistance. Further, they cannot duplicate a linear resistive output because of logarithmic characteristics associated with attenuators. Still further, these attenuators exhibit distortions which may be tolerable at audio frequencies but which make them unsuitable to duplicate precise resistances, particularly below 100 ohms.
"In accordance with this invention, a resistance producing circuit is constructed wherein a digital data source provides digitally encoded binary bits. Each discrete bit is applied to a control input of one of a plurality of switching devices, each device having a pair of terminals which are switched responsive to the discrete bit. These switching devices are serially coupled by their pairs of terminals, and each switching device further has a resistor coupled between these switched terminals. These resistors are selectively electrically removed or included in a summing circuit responsive to the discrete bits to generate a resistive output which is linear with respect to the sequence of digitally encoded bits."

INNOVATIVE DIGITAL POTENTIOMETER ARCHITECTURE

The presently preferred embodiment provides multiple features of novelty. To help provide a clear explanation of the claimed inventive features, some notable features of the preferred best mode of using the invention will first be described, before analyzing the particular points of innovation. However, it should be noted that this best-mode embodiment is necessarily somewhat specific, and does not define the full scope of the claimed inventive concepts.

The preferred best mode embodiment is an integrated circuit which provides two solid-state potentiometers. Each potentiometer contains a resistor string, and the endpoints of this resistor string are brought directly out to pins. For each potentiometer circuit, a "wiper" contact is also brought out to a pin.

Control logic receives a programmed resistance value, and accordingly activates one of 256 MOS switches (in each of the two potentiometers) to ohmically connect the wiper contact to a selectable intermediate point in the resistor string.

Thus, the user sees two three-terminal potentiometers, which can be used in essentially the same circuit configurations as two discrete mechanically-operated potentiometers could be, and which have the added advantage of being easily programmable by digital commands over a serial bus.

A multiplexed wiper port is also brought out. This permits the user to use the two potentiometers of each chip as one, as described below.

The resistor string is electrically floating if the external terminals are unconnected. Thus, the user really does have a well-behaved passive resistor to make use of. A passive resistor can be emulated with switched capacitors, or with active devices, but the noise and nonlinearity characteristics will typically not be as good as those of a simple passive device. Moreover, the temperature dependence will be different, which may be significant in some applications.

In the presently preferred embodiment, a connection is provided for a substrate bias connection. In a system where negative voltages are present, this bias connection can be connected to a negative voltage (as low as −5.5 V, in the presently preferred embodiment). If this is done, then voltages as negative as the bias voltage can be applied to the resistor string with no ill effects.

An alternative would be to use charge pumping techniques to avoid any problems of latchup. (This is done in the Xicor part referenced above.) However, such charge pumping techniques will tend to introduce electrical noise, which is very undesirable in an analog system.

Note that the potentiometer configuration is particularly convenient in analog circuits, since a single potentiometer can be used to configure the two resistors which define an op amp's gain.

SERIAL CONTROL INTERFACE

The selected resistor value is received over a simple serial port configuration. While the RST* line is held high, each pulse on the CLK (clock) line will cause a new bit of data to be shifted into a shift register. When the RST* line goes low, the value in the shift register is immediately applied to change the resistance at the wiper.

A similar serial command interface, and the daisy chain, were in the DS1292 Eliminator.[3] See U.S. Pat. No. 4,850,000, which is hereby incorporated by reference.

[3]This chip, and its data sheet in the 1989 Dallas Semiconductor Databook, are available from Dallas Semiconductor Corp., 4350 South Beltwood Parkway, Dallas 75244, and are hereby incorporated by reference.

DAISY-CHAINING TO CONTROL MULTIPLE CHIPS

In the presently preferred embodiment, each chip has not only clock, reset, and data inputs, but also has a data output. As data is clocked into the data input pin, and shifted through the shift register, the data at the other end of the shift register is connected (through an output buffer) to drive a data output pin.

COMBINATION WITH NONVOLATIZED SERIAL MEMORY

A particularly attractive configuration is to combine a nonvolatized serial memory on the serial control bus, such as a DS1204. The DS1204 (or equivalent) stores the desired resistor settings during periods when system power is off. At power-up, the system controller simply commands a read from the DS1204, and clocks the serial bus the needed number of times to reload the desired resistor settings into the potentiometer chips.

The data in the serial memory is preferably organized so that the last 17n bits of readout will contain the desired values to set into n potentiometer chips. Thus, the serial memory can share a common serial bus with the potentiometer chips; the protocol bits which are initially supplied to the serial memory will simply be shifted on through the potentiometers, and will not affect the final value of their settings.

DIRECTLY WRITABLE ARBITRARY VALUE

A significant advantage of the disclosed architecture is that the resistance value is directly selectable: there is only one step from position 1 to (for example) position 128. By contrast, the increment/decrement architecture of the Xicor part slows response and may provide unwanted intermediate states.

SYNCHRONIZED UPDATE

A further advantage of the disclosed architecture is that the change in resistance value occurs when the RST* line changes state. Thus, the timing of a change can be controlled independently of the particular change sought. Moreover, when multiple chips are daisy-chained onto a common serial command bus (as described below), all of the chips will change state at the same time.

CHIP WITH MULTIPLE DIGITALLY-CONTROLLED POTENTIOMETERS WHICH ARE STACKABLE OR SEPARABLE

In the presently preferred embodiment, the two pots on chip each have 256 bits of resolution, but can be stacked to achieve a single pot with 512 bits of resolution.

This can be performed very simply, by connecting the end terminals of the two potentiometers in series. (That is, the "high" pin H0 of one pot is tied to the "low" pin L1 of the other pot, and the remaining two high/low pins H1 and L0 provide the end terminals for the merged pot.) The user does not have to provide logic to select between the wiper pins W0 and W1: The wiper output for the merged pot is provided by a separate output pin ("$S_{OUT}$"), and an additional most-significant selection bit controls a low-impedance gate which connects this to one of the two wiper terminals W1 and W0.

INNOVATIVE THIN-FILM RESISTOR STRUCTURE

In the preferred layout, the contacts land on tabs which extend out from the resistor string, and do not land directly on the resistor string itself. There are several resulting advantages: One advantage is that variations in contact lithography and contact edge do not effect the long-range resistance of the resistor itself.

Moreover, the lack of "dogbone" shapes in the resistor string makes it easier to compute the resistance value of the string.

A further advantage of this layout technique is that the overall scale of the variable resistance can easily be changed simply by changing the width of the polysilicon in the meandering line which provides the resistor.

Note that, in the resistor meander, it is not necessary for the individual stages to be equal. For example, if the two arrays are given different increment values, a "double wiper" architecture could be used to map the most significant bits onto one side of the array, and less significant bits onto the other side of the array, so that the desired total resistance would be seen between the two wipers.

Note that the resistor array could be designed, for example, to have a logarithmic scale. This may be useful in telecomm applications, such as μ-law scaling or analogous scaling algorithms.

INNOVATIVE ARCHITECTURE FOR DIGITALLY-CONTROLLED COMPLEX IMPEDANCES

The disclosed architecture also can be adapted to provide a digital capacitor integrated circuit. The electrical configuration used for the capacitors is significantly different from that used for variable resistance, since capacitors are added by connecting them in parallel.

SCALING CAPACITORS IN POWERS OF TWO

In the presently preferred version of this embodiment, the selectable capacitor units have capacitances which are scaled in powers of two. This simplifies the switching logic, since fewer switches are needed. Moreover, since the capacitor values are scaled in powers of two, no decoder is needed: the 8 bits from the command register can be directly connected to select some combination of the 8 binary-scaled capacitors.

To make this scaling precise, without problems due to fringing fields, the higher-value capacitors are constructed by wiring multiple identical capacitors in parallel.

MAXIMUM TOTAL CAPACITANCE

In the layout of FIG. 7, the total area of the cells (for one potentiometer unit) is approximately 20 mils by 110 mils. (This gives an area of 2200 square mils, or 1.23 mm$^2$.) Using MOS capacitors to ground, with a typical specific capacitance of 1.5 fF per micron$^2$, this layout provides a maximum total capacitance of about 1000 pF. However, only about 10% of the cell area is used for the actual resistor line, and, if only this much area were used for capacitors, the maximum total capacitance would be only about 100 pF, which is too small for many applications. Therefore, it is preferable to expand the area used for capacitors, in this embodiment. Of course, the layout sizes can readily be scaled, but this gives an idea of the capacitance magnitudes which are readily available.

CAPACITOR DEVICE STRUCTURE

In the presently preferred embodiment, the capacitors are MOS capacitors to ground. FIG. 10 shows a sample embodiment which includes a variable capacitance, selected by bits loaded in over a serial interface.

A contemplated alternative embodiment uses poly-to-poly capacitors. Such capacitors have the advantage of greater linearity than MOS capacitors to bulk silicon. In the contemplated best mode, it is anticipated that poly-to-poly capacitors, with an oxide-nitride-oxide dielectric, would be used for the capacitive elements, to help achieve a high and reproducible specific capacitance per unit area. See U.S. Pat. No. 4,613,956, which is hereby incorporated by reference. Of course, other capacitor technologies, such as a corrugated trench capacitor, could also be used instead.

In a further alternative, if poly-to-poly capacitors are used, the capacitor could be configured to be floating between two external terminals. However, in this case, ESD protection structures would have to be added.

ALTERNATIVE THREE-TERMINAL CAPACITOR ARCHITECTURE

An alternative configuration uses an architecture which is more closely analogous to that of the potentiometer of FIG. 1:

256 (or $2^n$) cells each include a capacitor to ground, with an upper plate linked the RESIN terminal;

each cell also includes a decoder, buffer, and transmission gate, analogous to that shown in FIG. 8; however, one pair of connections is reversed, so that the transmission gates of all unselected cells are on, and the selected cell's transmission gate is off;

each cell's transmission gate is connected to link the RESIN terminal to the RESOUT terminal.

This alternative has the advantage that two complementary variable capacitances are available, at the two external terminals. This may be advantageous for applications where a ratio of two capacitors needs to be dynamically adjusted (e.g. for dynamic signal filtering with an averaging capacitor).

COMBINATION OF ANALOG FUNCTIONS

A great deal of work has been directed to emulating analog filter functions in digital or switched-capacitor circuits. However, an advantage of the architecture described here is that it really does provide an analog element: the only switching is DC switching, to connect or disconnect additional elements. Thus, the disclosed architecture may be applicable to trimming, matching, and tuning applications in circuits operating at VHF frequencies or higher.

The disclosed architecture provides analog functions which are readily programmable by a simple serial interface. One of the key advantages of digital signal processing has been the ability to rapidly change a filter function, and the disclosed architecture provides a much simpler way to do this. Such programmable analog functions can also be used to provide front-end processing of a signal source, in combination with digital signal processors.

In fact, a chip embodiment which is believed to be particularly advantageous is a chip which has one potentiometer and one variable capacitor on the same chip. This can be used, in combination with simple analog gain stages, to configure a variety of circuits which provide desired frequency-domain or time-domain characteristics.

Complex functions can be implemented by combining a digitally-controlled capacitor with a digitally-controlled resistor and an analog gain stage, in accordance with the teachings set forth herein. Such combinations can provide a variety of complex functions. For example, this can be used to provide a programmable bandpass filter, whose center frequency and Q are both tunable. The disclosed innovations permit complex analog functions to be readily implemented. The closed-loop gain of an amplifier gain stage is normally adjusted using a resistor ratio.[4] However, some embodiments of the disclosed architecture permit both the center frequency and Q of a gain stage to be selected independently. A programmable potentiometer, as described above, is linked to a gain stage, to define the gain of an op amp. In addition, a switchable network of capacitors is used to define the reactance which will determine the center frequency of the stage. The flexible filter design options thus provided can be used by system designers for programmable gain/attenuation, programmable analog phase-shifting or other functions.

[4] When a feedback resistor $R_F$ interposed in the feedback path from the output terminal to the negative input terminal of a differential amplifier, and an input resistance $R_{in}$ is interposed between the negative input terminal signal and an incoming signal $V_{in}$, the voltage gain $V_{out}/V_{in}$ will be equal to the ratio of the resistances $-R_F/R_{in}$.

BRIEF DESCRIPTION OF THE DRAWING

The present invention will be described with reference to the accompanying drawings, which show important sample embodiments of the invention and which are incorporated in the specification hereof by reference, wherein:

FIGS. 7A through 7D-1 show the mask layout for a cell of the resistor layout, in the chip of the presently preferred embodiment. These figures are overlaid views, to a common scale, showing the interrelation of the different mask levels. (Note that each of these overlays includes the contract level, for a common reference.) FIG. 7A shows the contact and active levels. FIG. 7B shows the contact, metal, and P+ mask levels. FIG. 7C shows the contact and well mask levels. FIG. 7D-1 shows the contact and polysilicon levels, for a first version of the chip of the preferred embodiment, in which the maximum resistance of each resistor string is 100 kilohms. FIG. 7D-2 shows the contact and polysilicon levels, for a second version of the chip of the preferred embodiment, in which the maximum resistance of each resistor string is 50 kilohms. FIG. 7D-3 shows the contact and polysilicon levels, for a third version of the chip of the preferred embodiment, in which the maximum resistance of each resistor string is 10 kilohms.

DESCRIPTION OF THE PREFERRED EMBODIMENTS

Figure 1:
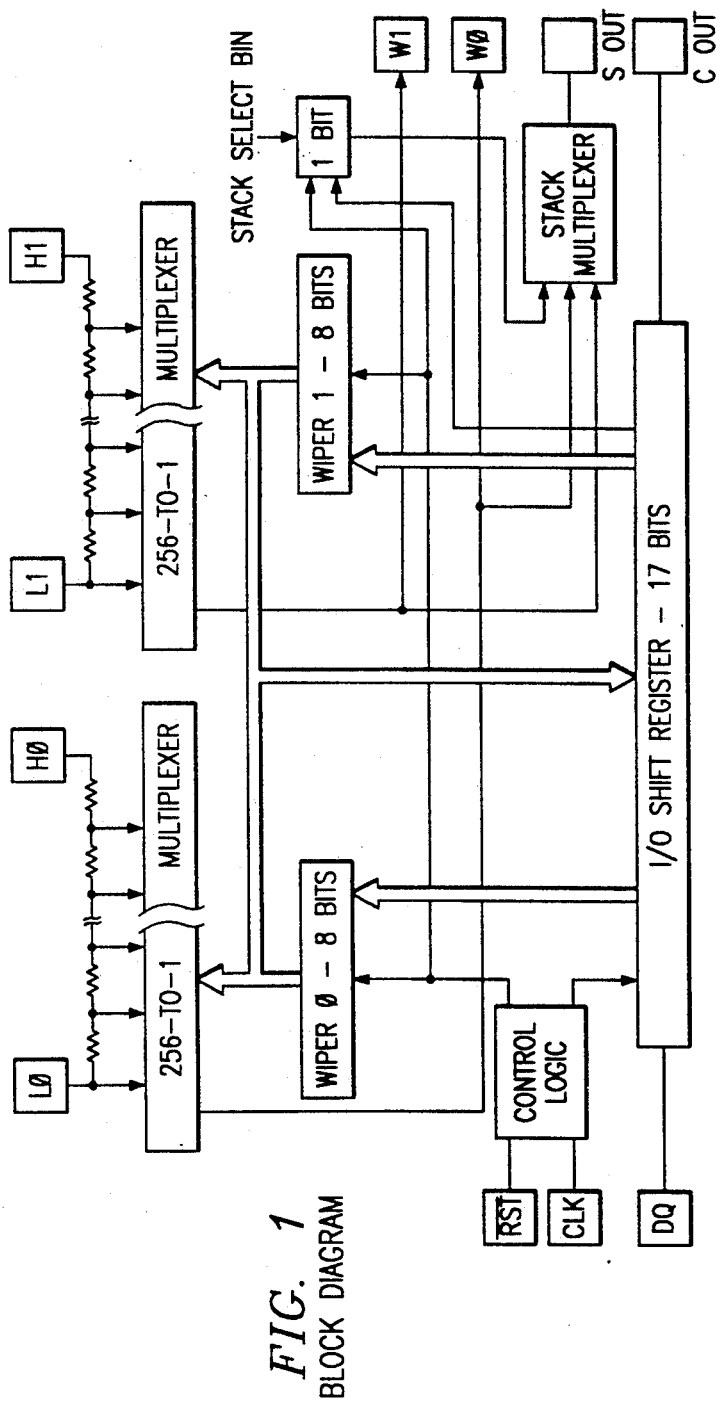
FIG. 1 shows the overall electrical organization of the chip of the presently preferred embodiment.

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

OPERATION OF THE PREFERRED EMBODIMENT

The chip of the preferred embodiments is a dual solid-state potentiometer that is set to value by digitally selected resistive elements. Each potentiometer is composed of 256 resistive sections. Between each resistive section and the low end of each potentiometer are tap points accessible to the wiper. The position of the wiper on the resistance array is set by an 8-bit register that controls which tap point is connected to the wiper output. Each 8-bit register can be read or written by sending or receiving data bits over a three-wire serial port.

In addition, the two potentiometers can be stacked such that a single potentiometer of 512 section results. When the two on-chip potentiometers are used separately, the resolution of each of the potentiometers is equal to the resistance value divided by 256. When the potentiometers are stacked end to end, the resistance value is doubled while the resolution remains the same.

The chip of the preferred embodiment contains two potentiometers that are divided into 256 resistance segments for each potentiometer. Each potentiometer has its wiper position set by a 8-bit value stored in a separate 8-bit wiper control register. The two 8-bit wiper control registers, and a 1-bit wiper select control register are read and written via a 17-bit shift register (See FIG. 1). Each potentiometer consists of 256 resistors of equal value. Tap points for the wiper connection are between each resistor and at the low end of the potentiometer. The 8-bit wiper control register for each potentiometer controls a 256 to 1 multiplexer that selects which tap point is connected to the wiper output. There is also a 2 to 1 multiplexer that selects which wiper is connected to the stack output terminal.

COMBINING THE TWO POTENTIOMETERS

The 2 to 1 wiper select multiplexer enables the potentiometers to be combined together in one effective potentiometer by connecting the two individual potentiometers in series. The convention that we use is for the high end of potentiometer 0 to be connected to the low end of potentiometer 1. When combining the two potentiometers on the chip, the wiper select bit is used to select which of the two potentiometer wipers will appear at the wiper select multiplexer output (WS). This bit accounts for the 17th bit in the 17-bit shift register. A zero written to the wiper select multiplexer control register will connect Wiper 0 to the WS output pin. The 8-bit control value for potentiometer 0 will determine which of the 256 lower taps of the combination potentiometer is selected for output on the WS pin. A 1 written to the wiper multiplexer control register will connect Wiper 1 to the WS output pin. The 8-bit control value for potentiometer 1 will determine which of the 256 upper taps of the combination potentiometer is selected.

SHIFT REGISTER

Figure 2:
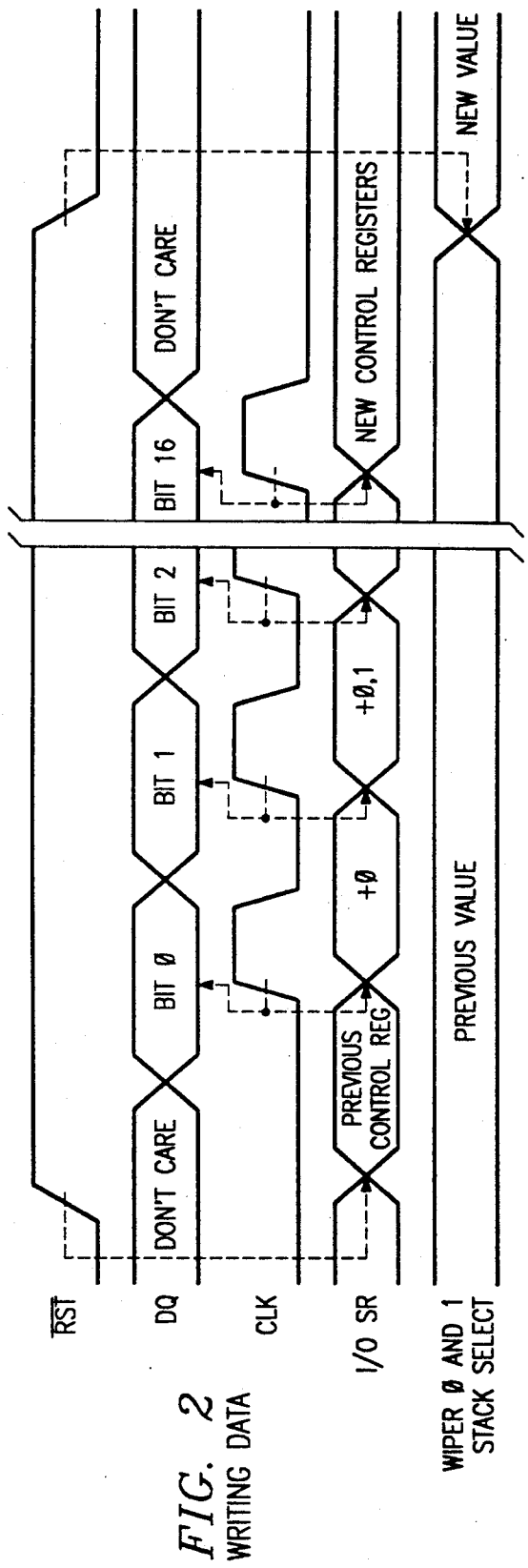
FIG. 2 shows the timing characteristics for writing a new set of command values into the chip of the presently preferred embodiment.

A shift register is used to transfer information between the chip of the preferred embodiment and the outside world. Information is written and read from the Wiper 0 and Wiper 1 register and the wiper select bit via the 17-bit I/O shift register. The I/O shift register is serially loaded by a 3-wire serial port consisting of the enable input (EN), the data in input (DIN), and clock input (CLK). This shift register is normally updated by transferring all 17 bits. This will enable a read and write of all bits in the three control registers. The shift register can also be operated with a lesser number of bits if reading or writing only some of the 17 bits. (FIG. 2). In those applications where the total capabilities of the part are not being utilized, then less than 17 bits can be transferred. For example, if only potentiometer 0 is utilized and not being read, then 8 bits are all that are needed to be transferred into the chip of the preferred embodiment.

ENABLE INPUT

There are three events that are controlled by the enable input. Data can be entered into the 17-bit shift register only when the EN input is at a high level. When the EN control input moves from low to high, the current contents of the three control registers are loaded into the 17-bit shift register. While at a high level, the EN control input allows serial entry of data via the DIN input pin and the CLK input pin. The potentiometers always maintain their previous value until the EN input is taken to low level. When the EN input goes from high to low, the current contents of the shift register are transferred to the three control registers. While the EN input is low, the DIN inputs and CLK inputs are ignored.

DATA INPUT

Data is entered into the I/O shift register from the $D_{in}$ input, while EN input is high, on the low-to-high transition of the CLK input. Data input on the DIN pin can be changed while the clock input is high or low, but only data meeting the setup requirements prior to the low to high transition will enter the shift register. Data is entered starting with the most significant bit first. If the full 17-bits are used, then the first bit will be the value of the wiper-select bit. The next bit will be the most significant bit of the 8-bit control value to position the wiper for potentiometer 1. The 17th bit, or last bit, to be entered will be the least significant bit of the 8-bit control value to position the wiper for potentiometer 0. If fewer than 17 bits are entered, the value of the potentiometer setting will result from the combination of the number of new bits that were entered plus the remaining bits of the old value that were shifted over by the number of new bits sent in. If more than 17 new bits are sent, only the last 17 new bits are left in the shift register. When ever the EN input goes from high to low, the current contents of the 17-bit shift register are moved into the three control registers.

DATA OUTPUT

When the EN input goes from low to high the current contents of the three control registers are moved into the 17-bit shift register. As new bits are entered into the shift register, the bits of the previous value are shifted out bit by bit on the serial out port pin (DOUT).

MULTIPLE CHIPS SHARING A COMMON SERIAL COMMAND BUS

Figure 3:
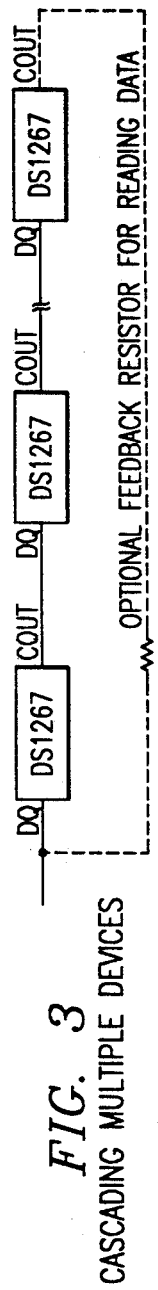
FIG. 3 shows how a common serial command bus can be used to independently address multiple chips of the presently preferred embodiment, in a daisy-chained configuration.
Figure 4:
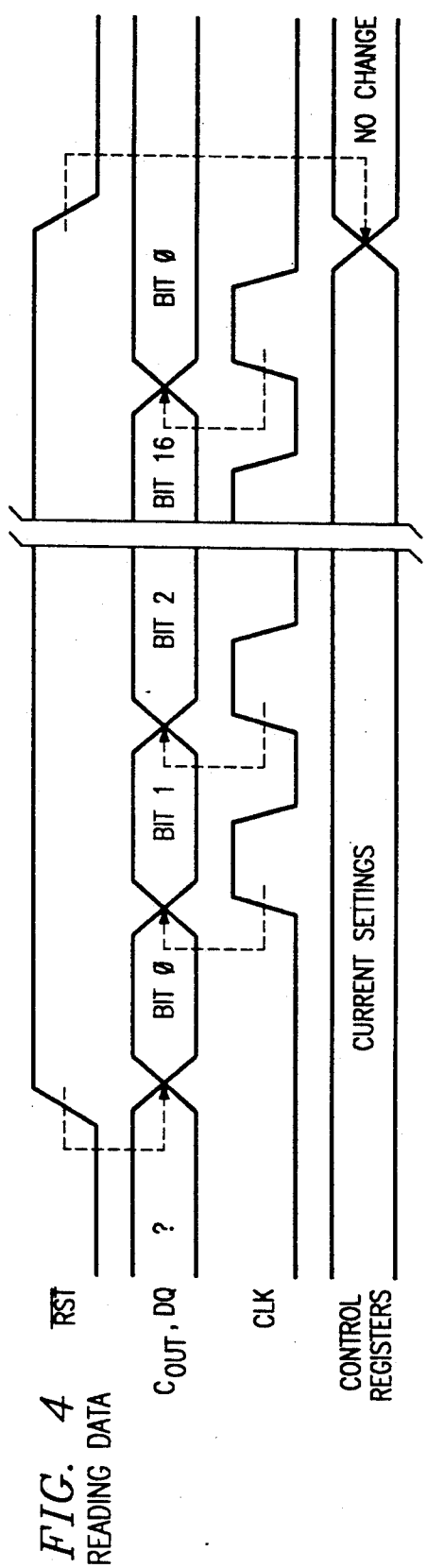
FIG. 4 shows the timing characteristics for reading out the stored set of command values from a chip of the presently preferred embodiment.
Figure 5:
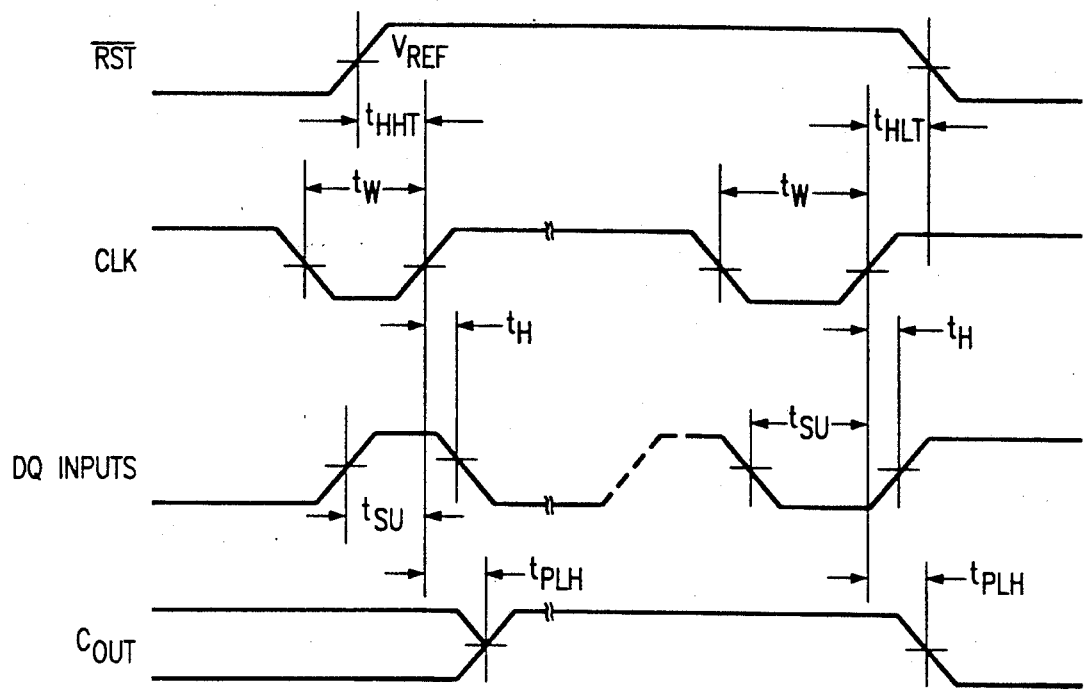
FIG. 5 shows greater detail regarding critical delays in the timing diagram of FIG. 2.

By connecting the DOUT pin of the previous chip of the preferred embodiment to the Din pin of a following chip of the preferred embodiment, multiple devices can be daisy-chained together as shown in FIG. 3. When connecting multiple devices, the total number of bits sent is nominally 17 times the number of chips in the daisy chain. In applications where it is desirable to read the settings of potentiometers, the DOUT pin of the last device connected in a daisy chain (one or more) can be connected to an input of another device. (See FIG. 4.)

There are two levels of storage within the chip of the preferred embodiment. (1) The three control registers store the values for the wiper 0, wiper 1, and wiper select multiplexers. (2) The 17-bit shift register. Values are moved between these two levels of storage. On the low to high edge of enable, the contents of the three control registers are moved into the shift register. On the high to low edge of enable, the contents of the 17-bit shift register are moved into the three control registers.

INITIAL SETTINGS

When $V_{cc}$ power is first applied to the chip of the preferred embodiment, the wiper settings for both potentiometers are set to their half position values and the wiper select bit is set to zero.

SPECIFICATIONS AND PARAMETERS FOR THE SAMPLE PREFERRED EMBODIMENT

Some of the exact specification values of the presently preferred embodiment will now be provided. These values are provided to assure inclusion of ample detail, and do not by any means limit the scope of any of the claimed inventions.

LINEARITY MEASUREMENTS

An important specification for the chip of the preferred embodiment Digital Potentiometer is linearity, that is, for a given digital input, how close the analog output is to that which is expected.

The test circuit used to measure the linearity of the chip of the preferred embodiment is set up in the worst case situation for linearity, which is the combined configuration. This gives 512 possible settings for the composite potentiometer. Note that to get an accurate output voltage, it is necessary to assure that the output current is 0, in order to negate the effects of wiper impedances RW1 and RW0, which are typically 400 ohms. For any given setting N for the composite pot, the expected voltage output at the WS output is:

$$V_o = -5 + (10*(N/512))(\text{in volts}).$$

Absolute linearity is a comparison of the actual measured output voltage versus the expected value given by the equation above, and is given in terms of an LSB, which is the change in expected output when the digital input is incremented by 1. In this case, the LSB is 10/512 or 0.01953 Volts. The equation for the absolute linearity of the chip of the preferred embodiment is:

$$\frac{V_o(\text{actual}) - V_o(\text{expected})}{LSB} = AL(\text{in } LSB\text{'s})$$

The specification for absolute linearity of the chip of the preferred embodiment is + or $-0.5$ LSB maximum.

Another significant measure of linearity is relative linearity. The expected change in voltage between any two consecutive pot settings is an LSB. Relative linearity is a comparison of the actual difference between any two consecutive pot settings versus the expected LSB difference. The equation for the relative linearity is:

$$\frac{V_o(N) - V_o(N+1) - LSB}{LSB} = RL(\text{in } LSB\text{'s})$$

The specification for relative linearity for the chip of the preferred embodiment is $\pm 0.2$ LSB maximum.

ANALOG CHARACTERISTICS

End-to-End Resistance Tolerance = $\pm 20\%$
Typical Noise $\leq -120$ dB/Hz (Ref: 1 V)

Absolute Linearity = ±1.0 MI
Relative Linearity = 0.2 MI
Temperature Coefficient = ±300 ppm/°C. Typical.
NOTES
1. Absolute linearity is used to determine wiper voltage versus expected voltage as determined by wiper position.
2. MI = RTOT/256 or VH−VL = minimum increment.
3. Relative linearity is used to determine the change in voltage between successive TAP positions.
4. Typical values are for TA = 25° C. and nominal supply voltage.

The high-frequency cutoff varies depending on the wiper setting. For a midpoint wiper setting, the −3 dB frequency is approximately 38 kHz for the 100 kΩ version, and approximately 140 kHz for the 10 kΩ version. (The 10K version has a lower cutoff because its resistor string is straighter and wider.)

CIRCUIT IMPLEMENTATION OF THE SAMPLE PREFERRED EMBODIMENT

Figure 6:
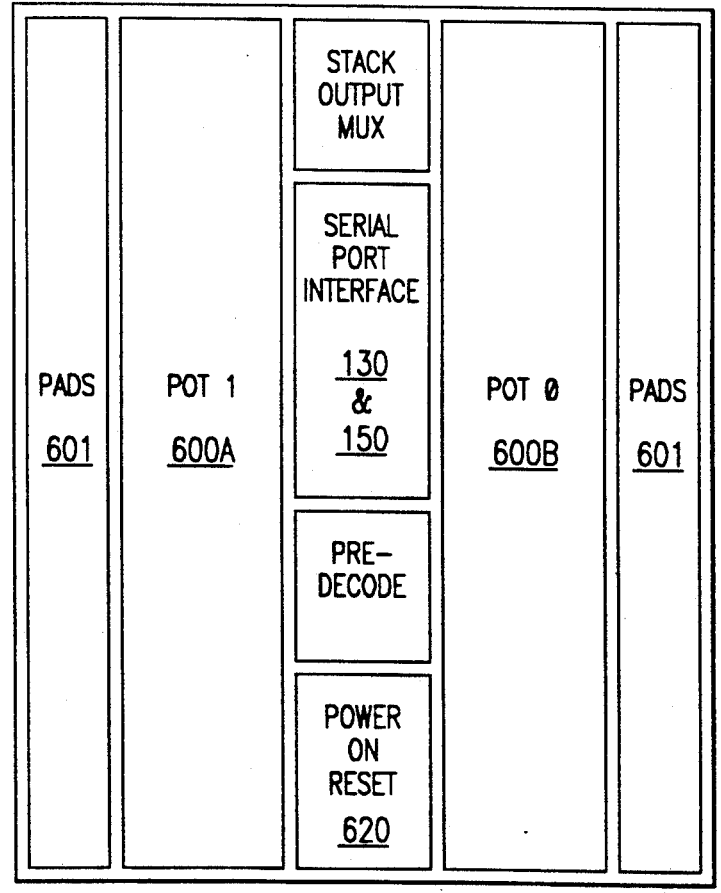
FIG. 6 shows the physical organization of the chip of the presently preferred embodiment.
Figure 9:
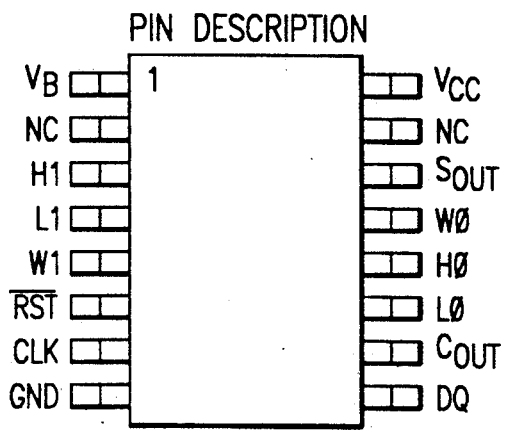
FIG. 9 shows the pinout of the chip of the presently preferred embodiment.

FIG. 9 shows the pinout of the chip of the presently preferred embodiment, and FIG. 6 shows the high-level physical organization of the chip of the presently preferred embodiment.

The two potentiometer structures 600A and 600B take up most of the area of the chip. Each of the structures 600 includes a 256-to-1 multiplexer 110, mated with a 256-tap resistor string 120.

Contact pads 601, with associated ESD protection structures and buffers, take up a large additional fraction of the area, in this example. (This chip does not use a large number of contact pads, so the designer has considerable flexibility with the location of these.)

The serial shift register 130, and control logic 150, are located between the two potentiometer structures, in this example.

Predecoder 610 is connected to pre-decode pairs of the select lines 131. This reduces the total requirement for wire routing around the chip.

Power-on reset logic 620 implements a simple NAND combination, so that the chip will not be enabled, upon power-up, until the supply voltage has risen above the N-channel threshold voltage and a certain minimum delay has elapsed.

Figure 8:
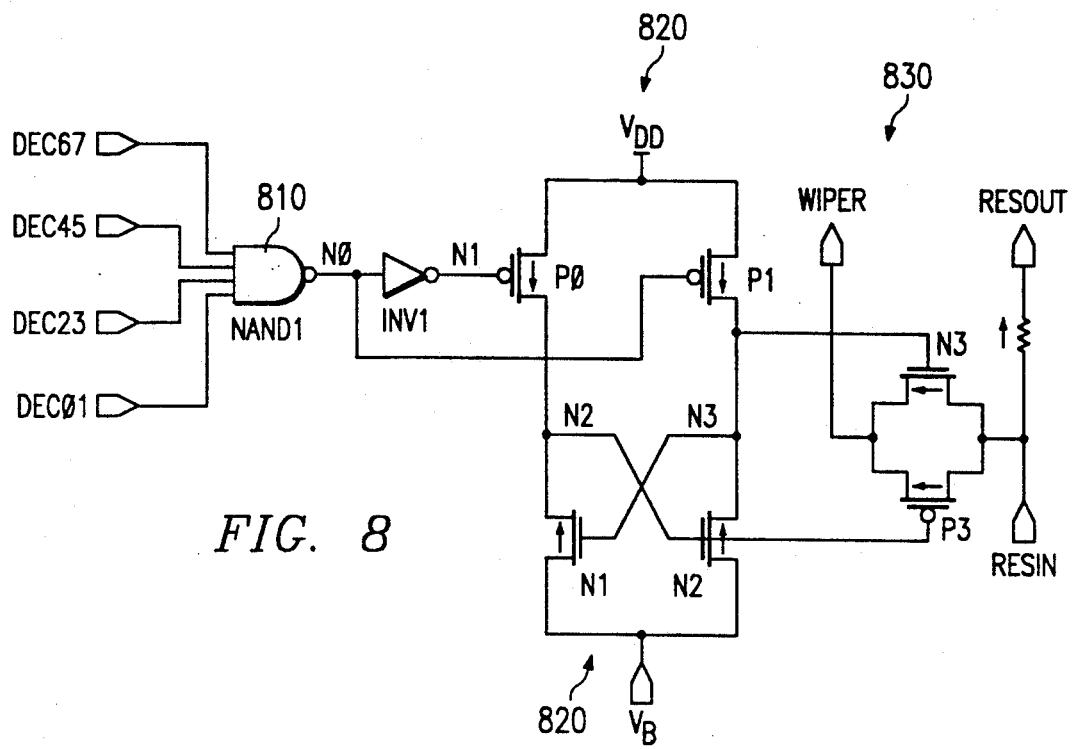
FIG. 8 shows the circuit organization of a single cell in one of the potentiometers 600, in the presently preferred embodiment.

FIG. 8 shows the circuit organization of a single cell in one of the potentiometers 600, the presently preferred embodiment. (256 such cells are connected in series, to form each of the resistor strings 120A and 120B, in the presently preferred embodiment.)

The cell shown receives four pre-decoded lines, from the four 2-bit predecoders used in each 8-bit multiplexer 110. If all four of these predecoded lines are high, NAND gate 810 will turn on the level-shifter circuit 820, which drives the transmission gate 830. This will connect the cell's node, in the resistor string, to the WIPER output. The RESOUT terminal of this cell will be connected to the RESIN terminal of the next cell, and the RESIN terminal of this cell will be connected to the RESOUT terminal of the preceding cell. Thus, a resistor string 120 is provided between external terminals H0 and L0, and between H1 and L1.

Note that the bias voltage $V_B$ provides the low voltage to level-shifter 820, so that, when the cell is not selected, the NMOS half of transmission gate 830 will receive a maximally negative voltage. Thus, even if a negative voltage is externally applied to the resistor string, the NMOS side of the transmission gate 830 cannot accidentally be turned on or suffer a large subthreshold current, as long as the voltage externally applied is not more negative than $V_B$.

CELL LAYOUT OF THE SAMPLE PREFERRED EMBODIMENT

Figure 7B:
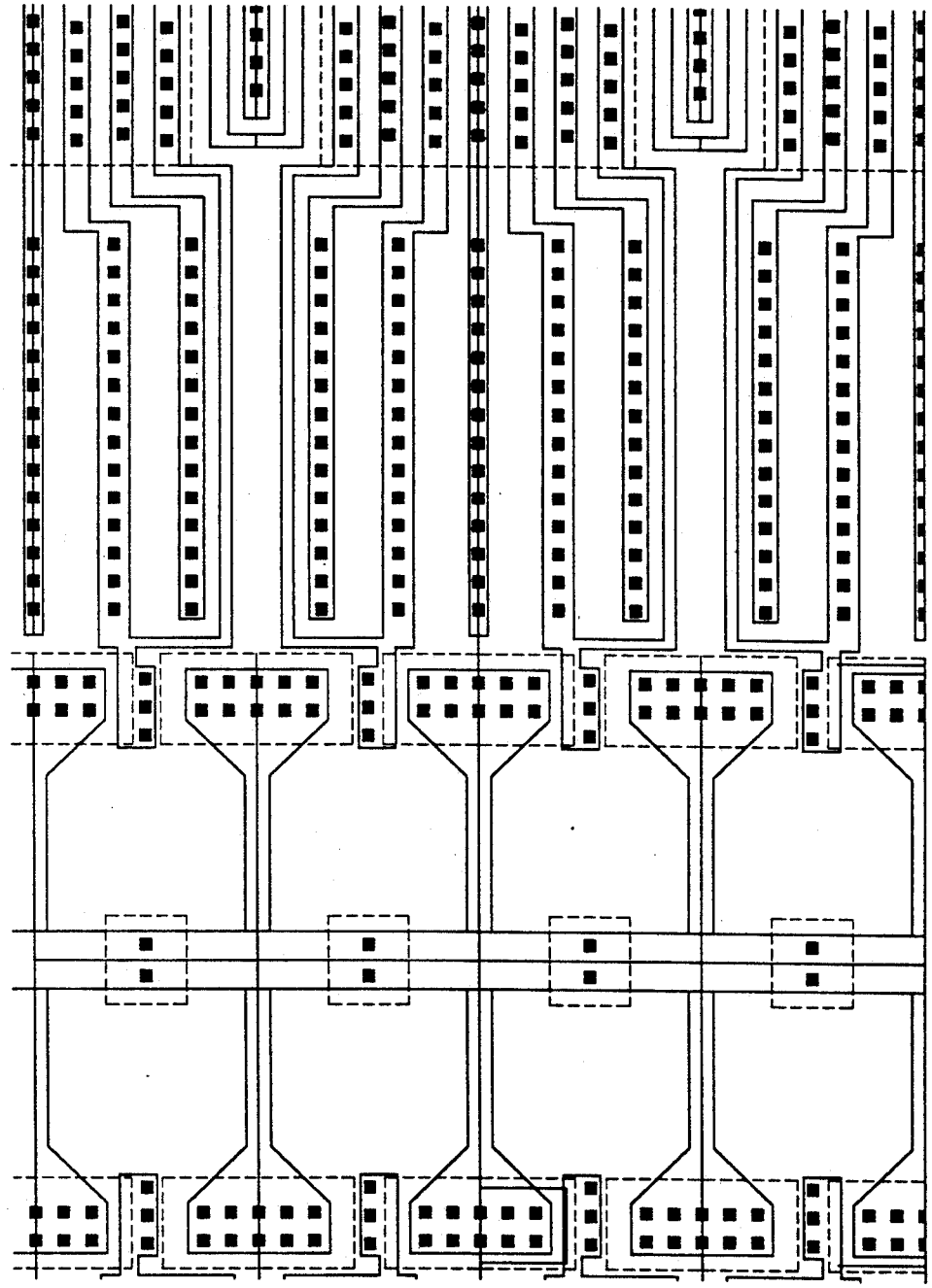
Figures 1, 7D:
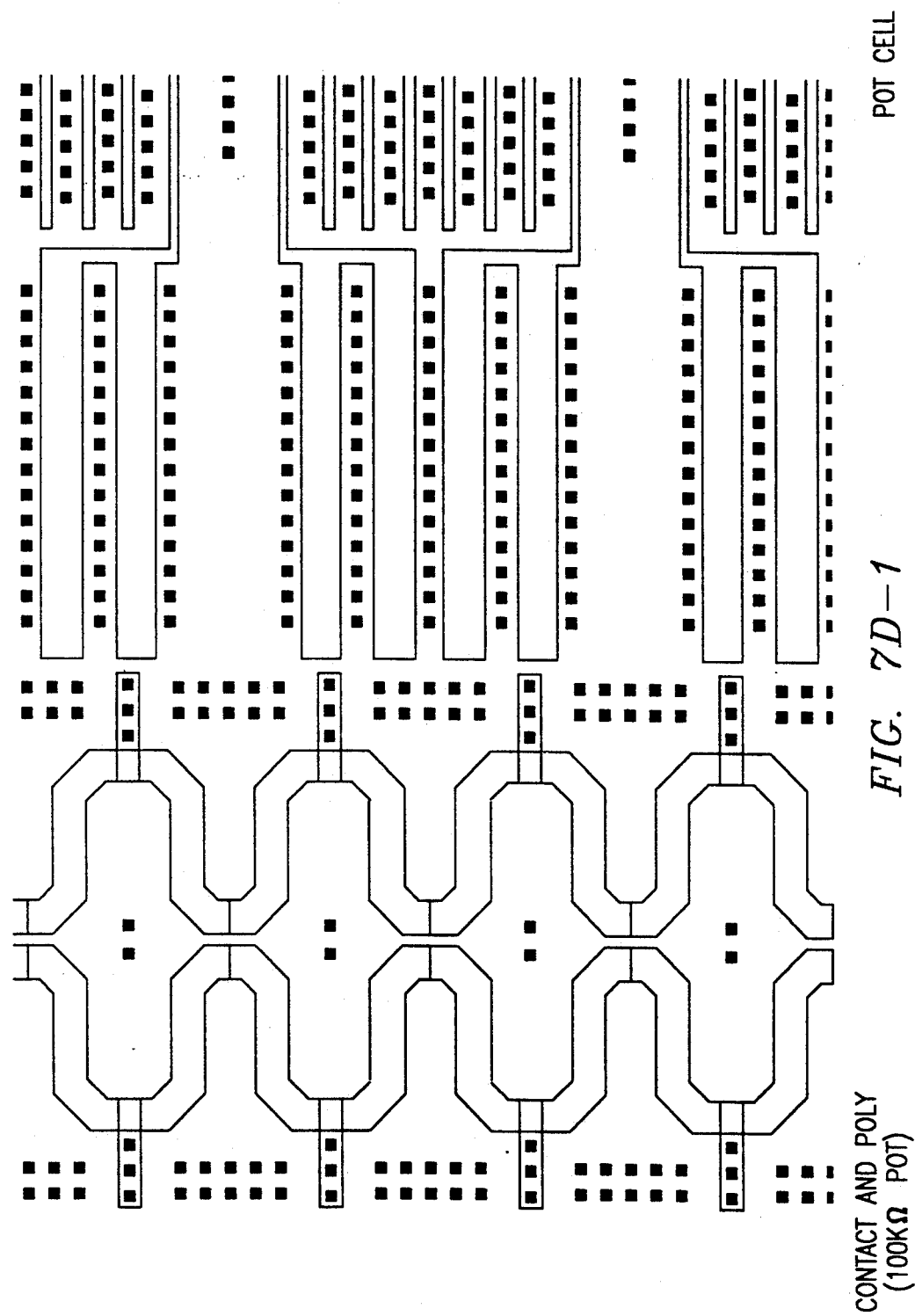
Figures 3, 7D:
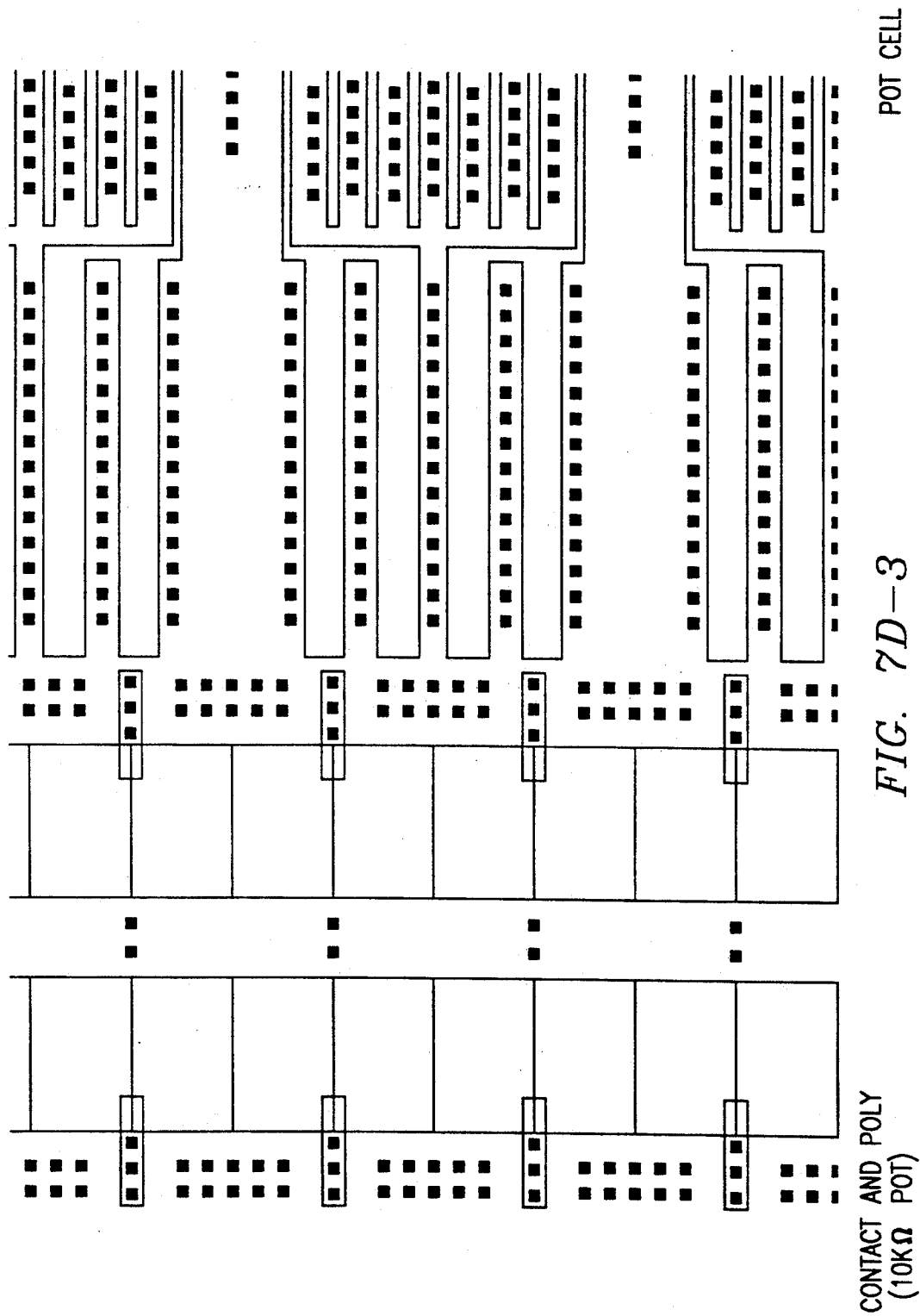

FIGS. 7A through 7D-1 show the mask layout for a cell of the resistor layout, in the chip of the presently preferred embodiment. These figures are overlaid views, to a common scale, showing the interrelation of the different mask levels. (Note that each of these overlays includes the contract level, for a common reference.) FIG. 7A shows the contact and active levels. FIG. 7B shows the contact, metal, and P+ mask levels. FIG. 7C shows the contact and well mask levels. FIG. 7D-1 shows the contact and polysilicon levels, for a first version of the chip of the preferred embodiment, in which the maximum resistance of each resistor string is 100 kilohms.

As noted above, a particular advantage of the disclosed thin-film resistor structure is that the total resistance can easily be changed. This can readily be seen from comparison of FIGS. 7D-1, 7D-2, and 7D-3. These show three different versions of the polysilicon mask level, but any one of these version can be used in combination with the active, well, P+, contact, and metal levels shown in FIGS. 7A-7C to construct a working circuit.

If the polysilicon mask level of FIG. 7D-1 is used in combination with the levels of FIGS. 7A-7C, the maximum resistance of each potentiometer, in the finished part, will be approximately 100 kΩ.

If the polysilicon mask level of FIG. 7D-2 is used in combination with the levels of FIGS. 7A-7C, the maximum resistance of each potentiometer, in the finished part, will be approximately 50 kΩ.

If the polysilicon mask level of FIG. 7D-3 is used in combination with the levels of FIGS. 7A-7C, the maximum resistance of each potentiometer, in the finished part, will be approximately 10 kΩ.

In going from the high-resistance pattern of FIG. 7D-1 to the successively lower resistance patterns of FIGS. 7D-2 and 7D-3, note that the resistor string is made steadily wider and straighter.

Of course, it will be apparent to those skilled in the art that other mask levels (such as protective-overcoat-removal, $V_T$-adjust, etc.) must normally be used in conjuction with the mask levels shown, to produce a complete integrated circuit. However, the levels shown are sufficient to indicate, to those skilled in the art, the preferred features of the contemplated best mode, and the structure of the additional levels will be entirely obvious.

It should also be noted that the presently preferred embodiment is actually implemented in a very straightforward and simple CMOS process, using no silicides, one layer of polysilicon, and one layer of metal. However, an immense variety of process modifications could readily be made, and the specific process implementation is believed not to be at all critical.

DIGITAL CAPACITOR INTEGRATED CIRCUIT

Figure 10:
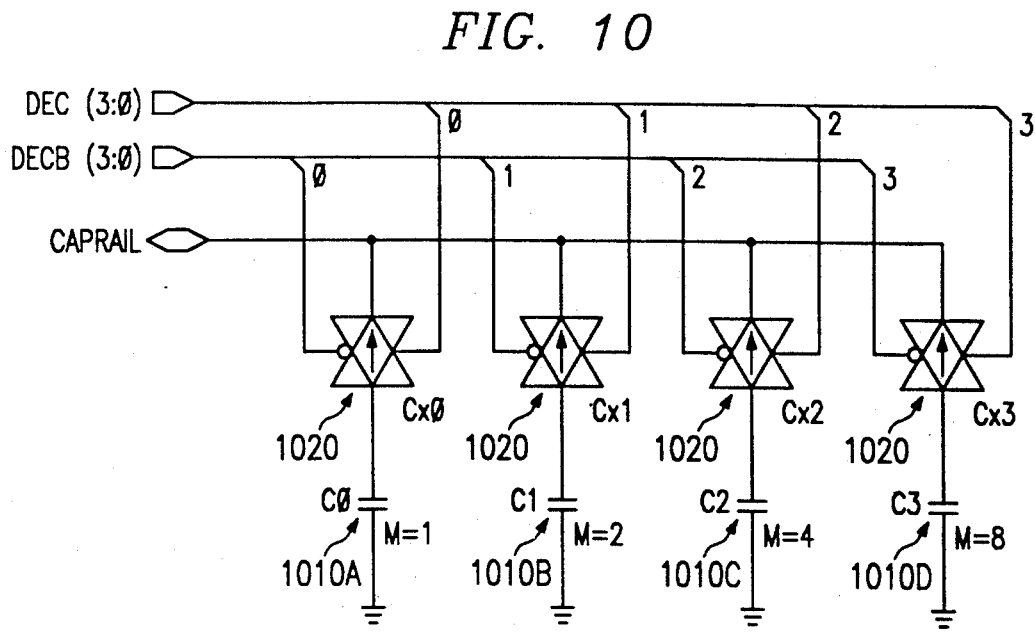
FIG. 10 shows an alternative embodiment which includes a variable capacitance, selected by bits loaded in over a serial interface.

FIG. 10 shows the best mode, as presently contemplated, for implementing a digital capacitor integrated circuit.

For clarity, the exmaple shown is a simplified structure, which includes only 4 capacitors. The stage illustrated can provide any one of $2^4$ capacitance values. In practical embodiments, more capacitors are preferably used, to give more bits of resolution.

The capacitors 1010 are each accessed by a respective transmission gate 1020. The selected capacitors are connected to a line CAPRAIL, which is (in this embodiment) brought out to an external pin. The decode busses ($DEC_{3:0}$ and $DECB_{3:0}$) are outputs of a four bit register.

In the example shown, the capacitors 1010 are MOS capacitors, with a gate oxide thickness of 20-25 nm, and the capacitance per unit area is in the range of approximately of 1.4-1.7 fF/micron$^2$.

FURTHER MODIFICATIONS AND VARIATIONS

It will be recognized by those skilled in the art that the innovative concepts disclosed in the present application can be applied in a wide variety of contexts. Moreover, the preferred implementation can be modified in a tremendous variety of ways. Accordingly, it should be understood that the modifications and variations suggested below and above are merely illustrative. These examples may help to show some of the scope of the inventive concepts, but these examples do not nearly exhaust the full scope of variations in the disclosed novel concepts.

In a less-preferred alternative, the disclosed layout can be used with an additional doping mask, so that the resistance line is more lightly doped than the lines, in the same thin film level, which are used for interconnect. An advantage of the disclosed layout, in this context, is that the boundary of the additional mask can be routed across the tabs which extend out from the resistance line. Thus, processing variation in this step will not affect the series resistance of the resistance line.

In a further less-preferred alternative, if it is desired to provide a range to very high resistance values, the disclosed layout can even be used with intrinsic poly or SIPOS resistor line. Again, the boundary for the poly doping mask, while subject to some uncertainty (and lateral diffusion effects), could be made to fall in the tab and not in the main resistor line.

In a further alternative, a boundary of silicide cladding can be drawn across the tabs. Again, this has the advantage that high-sheet-resistance material can be used for the resistance line, without introducing uncertainties into the contact resistances. And other alternatives include use of titanium nitride for the resistor material, the tabs but not the resistor line are overlain by a metal silicide, the resistor material is polycrystalline with more than 95 percent atomic of silicon and may be doped to a sheet resistance of less than 100 ohms per square, and the resistor material is polycrystalline with more than 70 percent atomic of silicon and more than 1 percent atomic of oxygen. Also, the metal layer could be an aluminum alloy such as silicon-doped aluminum or copper-doped aluminum.

A further important variation is that the two potentiometers on each chip need not have the same scale. In fact, there are significant advantages to using different scales for the two potentiometers.

Of course, for precision applications, laser ROM, (or NVRAM, i.e. nonvolatized RAM, which may or may not be accessible to the user) can be used to store trimming bits—e.g. an offset value corresponding to contact resistance variation, and a scaling value corresponding to variation in the series resistance value.

In a further alternative, the switches into the resistor line could be connected so that each switch (or some switches) would short out a section of the resistor line.

In the presently preferred embodiment, the sheet resistance of the polysilicon layer is about 33 ohms per square, and this is used to achieve resistance values of 10K + 10K to 100K + 100K. If the disclosed resistor geometry were implemented in another material, other values could readily be obtained. Note that the operation of the chip, in the presently preferred embodiment, is completely DC except when control bits are being clocked through or latched in. Therefore, in some applications, higher-sheet-resistance polysilicon could be used, if desired, at the expense of a slower clock rate on the digital I/O lines.

Alternatively, the potentiometer chip of the presently preferred embodiment could be made nonvolatile if desired. This would add considerable overhead to the chip, but could be implemented if desired, using methods analogous to those used in the DS1292 Eliminator chip referred to above. However, it is presently believed to be preferable to use a nonvolatized serial memory on the serial control bus, as described above, and simply clock in the needed resistor settings at power-up.

It should also be noted that the disclosed architecture is particularly well suited to integration on the same chip with active analog circuits, such as op amps. In the disclosed architecture, the logic circuits never change state unless the serial bus is active. Thus, during steady-state operation, the analog circuits would not be perturbed by noise from the digital circuitry. This architecture can be implemented with pure CMOS device technology, or (as is common in analog integrated circuits) with biCMOS technology.

As will be recognized by those skilled in the art, the innovative concepts described in the present application can be modified and varied over a tremendous range of applications, and accordingly their scope is not limited except by the allowed claims.

What is claimed is:

1. An integrated circuit resistor, comprising:
   a resistor line, consisting essentially of a strip of a thin film of a resistive material;
   additional quantities of said thin film material being laterally extended from said resistor line, in multiple locations, to provide contact tabs;
   multiple switching devices, each connected to selectably make connection to a respective one of said contact tabs;
   wherein essentially all electrical contacts to said resistor line are physically located in said contact tabs, and not in said resistor line.

2. The integrated circuit resistor of claim 1, wherein said thin-film resistive material consists essentially of doped polysilicon.

3. The integrated circuit resistor of claim 1, wherein said resistive material comprises titanium nitride.

4. The integrated circuit resistor of claim 1, wherein said tabs, but not said resistor line, are overlain by a metal silicide.

5. The integrated circuit resistor of claim 1, wherein said thin-film resistive material is polycrystalline and comprises more than 95 percent atomic of silicon.

6. The integrated circuit resistor of claim 1, wherein said thin-film resistive material is polycrystalline and comprises more than 95 percent atomic of silicon and is doped to provide a sheet resistance which is less than 100 ohms per square.

7. The integrated circuit resistor of claim 1, wherein said thin-film resistive material is polycrystalline and comprises more than 70 percent atomic of silicon, and comprises more than one percent atomic of oxygen.

8. An integrated circuit resistor, comprising:
- a resistor line, consisting essentially of a strip of a thin film resistive material;
- additional quantities of said thin film material being laterally extended from said resistor line, in multiple locations, to provide contact tabs;
- a thin film metal layer, patterned to provide wiring in a predetermined pattern, and to provide contacts in multiple locations to individual respective ones of said contact tabs;
- multiple switching devices, each respectively connected, through electrical paths which include wiring in said metal layer, to selectably make connection to a respective one of said contact tabs;
- wherein essentially all electrical contacts to said resistor line are physically located in said contact tabs, and not in said resistor line.

9. The integrated circuit resistor of claim 8, wherein said metal layer consists of an aluminum alloy.

10. The integrated circuit resistor of claim 8, wherein said metal layer consists essentially of silicon-doped aluminum.

11. The integrated circuit resistor of claim 8, wherein said metal layer consists essentially of copper-doped aluminum.

12. The integrated circuit resistor of claim 8, wherein said metal layer consists of an aluminum alloy, and wherein said tabs, but not said resistor line, are overlain by a metal silicide.

13. The integrated circuit resistor of claim 8, wherein said metal layer consists of an aluminum alloy, and wherein said thin-film resistive material is polycrystalline and comprises more than 95 percent atomic of silicon.

14. The integrated circuit resistor of claim 8, wherein said thin-film resistive material is polycrystalline and comprises more than 95 percent atomic of silicon and is doped to provide a sheet resistance which is less than 100 ohms per square.

15. The integrated circuit resistor of claim 8, wherein thin-film resistive material is polycrystalline and comprises more than 70 percent atomic of silicon, and comprises more than one percent atomic of oxygen.

16. An integrated circuit potentiometer,
- comprising a resistor line, consisting essentially of a strip of a thin film of a resistive material located in a rectangular area;
- additional quantities of said thin film material being laterally extended from said resistor line and across a side of said rectangular area, in multiple locations, to provide contact tabs located outside of said rectangular area; and
- multiple switching devices, each connected to selectably make connection to a respective one of said contact tabs;

17. The integrated circuit potentiometer of claim 16, wherein said resistor line meanders within said rectangular area.

18. The integrated circuit potentiometer of claim 16, wherein said resistor line has a side coinciding with said side of said rectangular area.

* * * * *